(12) United States Patent
Sonnabend et al.

(10) Patent No.: US 7,428,151 B2
(45) Date of Patent: Sep. 23, 2008

(54) COOLING ARRANGEMENT

(75) Inventors: Werner Sonnabend, Straubenhardt (DE); Mouhamadou Ousmane, Marburg (DE); Wilfried Braun, Dietzhölztal-Ewersbach (DE); Kurt Schaffer, Eckental (DE)

(73) Assignee: RITTAL RES Electronic Systems GmbH & Co. KG, Herborn (DE)

( * ) Notice: Subject to any disclaimer, the term of this patent is extended or adjusted under 35 U.S.C. 154(b) by 383 days.

(21) Appl. No.: 11/262,295

(22) Filed: Oct. 28, 2005

(65) Prior Publication Data

US 2006/0109633 A1 May 25, 2006

(30) Foreign Application Priority Data

Nov. 9, 2004 (DE) .................. 10 2004 054 337

(51) Int. Cl.
*H05K 7/20* (2006.01)

(52) U.S. Cl. .................. 361/699; 361/698; 361/720

(58) Field of Classification Search .................. 361/720, 361/698, 699
See application file for complete search history.

(56) References Cited

U.S. PATENT DOCUMENTS

| | | | | |
|---|---|---|---|---|
| 4,493,010 A * | 1/1985 | Morrison et al. | ............ | 361/698 |
| 4,962,444 A * | 10/1990 | Niggemann | .................. | 361/702 |
| 5,285,347 A * | 2/1994 | Fox et al. | .................... | 361/699 |
| 5,365,749 A * | 11/1994 | Porter | ........................ | 62/259.2 |
| 5,740,018 A * | 4/1998 | Rumbut, Jr. | .................. | 361/720 |
| 6,052,285 A * | 4/2000 | Hileman | ...................... | 361/699 |
| 6,536,510 B2 * | 3/2003 | Khrustalev et al. | ...... | 165/104.33 |
| 6,644,058 B2 * | 11/2003 | Bash et al. | .................. | 62/259.2 |
| 6,807,056 B2 * | 10/2004 | Kondo et al. | ................. | 361/689 |
| 6,836,407 B2 * | 12/2004 | Faneuf et al. | ............... | 361/687 |
| 6,999,316 B2 * | 2/2006 | Hamman | ..................... | 361/701 |
| 7,010,930 B2 * | 3/2006 | Arik et al. | .................... | 62/259.2 |
| 7,012,807 B2 * | 3/2006 | Chu et al. | .................... | 361/699 |
| 7,187,549 B2 * | 3/2007 | Teneketges et al. | ......... | 361/699 |
| 2003/0000721 A1 * | 1/2003 | Garner | ........................ | 174/50 |
| 2003/0010477 A1 * | 1/2003 | Khrustalev et al. | ...... | 165/104.33 |
| 2003/0057546 A1 * | 3/2003 | Memory et al. | ............. | 257/706 |
| 2004/0008483 A1 * | 1/2004 | Cheon | ........................ | 361/687 |
| 2004/0037045 A1 * | 2/2004 | Phillips et al. | ............... | 361/719 |
| 2004/0163797 A1 * | 8/2004 | Cosley et al. | .............. | 165/80.4 |
| 2004/0221604 A1 * | 11/2004 | Ota et al. | .................... | 62/259.2 |
| 2006/0002080 A1 * | 1/2006 | Leija et al. | ................... | 361/687 |
| 2006/0067047 A1 * | 3/2006 | Pfahnl | ........................ | 361/699 |

FOREIGN PATENT DOCUMENTS

EP 1148 040 A2 8/2004

* cited by examiner

*Primary Examiner*—Anatoly Vortman
(74) *Attorney, Agent, or Firm*—Pauley Peterson & Erickson

(57) ABSTRACT

A cooling arrangement with a housing for receiving electronic printed circuit boards or plug-in modules, and with an air-conditioning device which is connected via a coolant-conducting feed line and a return-flow line with at least one electronic component, to be cooled, on the respective printed circuit board or the plug-in module. The feed line is coupled with at least one component feed line assigned to the electronic component. The return-flow line is coupled with at least one component return-flow line assigned to the electronic component. The printed circuit board or the plug-in module has an area for fitting electronic components and a coupling area for coupling the feed line with the component feed line and for coupling the return-flow line with the component return-flow line.

14 Claims, 3 Drawing Sheets

COOLING ARRANGEMENT

BACKGROUND OF THE INVENTION

1. Field of the Invention

This invention relates to a cooling arrangement with a housing for receiving electronic printed circuit boards or plug-in modules, and with an air-conditioning device which is connected via a coolant-conducting feed line and a return-flow line with at least one electronic component, to be cooled, on the respective printed circuit board or plug-in module, wherein the feed line is coupled with at least one component feed line assigned to the electronic component, and the return-flow line is coupled with at least one component return-flow line assigned to the electronic component.

2. Discussion of Related Art

A cooling arrangement is known from European Patent Reference EP 1 448 040 A2. Plug-in modules, which are arranged on top of each other in a horizontal plane are housed in a switchgear housing. Built-in electronic devices are located on the plug-in modules, in particular CPUs of computer servers, which require specific cooling. Because the generated heat cannot be removed to a sufficient degree by known air cooling fans, cooling by coolants are employed. The components to be cooled are cooled by cooling bodies, through which a fluid flows and which are connected with an air-conditioning device through feed and return-flow lines.

The layout of the plug-in module used in the known cooling arrangement, or its fitting with components, and the arrangement of strip conductors, are matched to the arrangement of the cooling bodies through which liquid flows and the connectors of the component feed and component return-flow hoses. With the known cooling arrangement it is not possible without a considerable structural cost outlay to use plug-in modules of any arbitrary layout and to provide them with liquid cooling.

SUMMARY OF THE INVENTION

It is one object of this invention to provide a printed circuit board or plug-in module of any arbitrary layout with liquid cooling without substantially changing the layout or the fitting with electronic components.

The above and other objects of this invention are accomplished with a housing arrangement having characteristics described in the claims and this specification.

Accordingly, the printed circuit board or plug-in module of this invention has an area for fitting electronic components and a coupling area for coupling the feed line with the component feed line, and for coupling the return-flow line with the component return-flow line. A separate coupling area is created on the printed circuit board or the plug-in module, besides an area provided for a predetermined layout and fitting, and the area for fitting it is only necessary to attach the cooling elements through which liquid flows to the components to be cooled. Coupling to the remaining cooling system is performed in the coupling area.

Thus the coupling area can adjoin the area for fitting. The coupling area can additionally or alternatively be provided at the upper edge area of the printed circuit board or the plug-in module.

In one embodiment, the component feed line and the component return-flow line have coupling elements attached at the ends of the coupling area. These form, together with the counter coupling elements of the feed line and the return-flow line attached at the end of the housing, a releasably coupled connection. With this arrangement, it is possible to directly couple a liquid-cooled printed circuit board or plug-in module to the feed line and to the return-flow line which are connected with the air-conditioning device. Thus, the electronic components to be cooled can be easily connected with a liquid cooling body through which liquid flows and which has a connector for the component feed line and a connector for the component return-flow line.

It is also possible to arrange the coupling element of the component feed line and the coupling element of the return-flow line side-by-side in a plug housing. A coupling block is thus formed, which assures a definite spatial arrangement of the two coupling elements.

The counter coupling element of the feed line and the counter coupling element of the return-flow line can be arranged side-by-side in a plug housing. A counter coupling block is thus formed, which corresponds in a particularly advantageous manner to the coupling head of the component feed line and the component return-flow line.

The coupling connection can be designed as a no-drip releasable and pluggable coupling to prevent cooling liquid from running out when pulling out the printed circuit board or plug-in module.

In one embodiment, a rear transition module at the rear of the housing can be assigned to the respective printed circuit board or plug-in module, which has plug connectors for electrical input and output signals. Corresponding electrical counter plug connectors at the printed circuit board or the plug-in module engage the rear transition module. The coupling elements of the component feed line or the component return-flow line in the area of or near the electrical counter plug connectors are arranged at the printed circuit board or the plug-in module, and the counter coupling elements of the feed line or the return-flow line are arranged on the rear transition module. It is thus possible with this arrangement to create a plurality of different connecting options within a narrow space.

BRIEF DESCRIPTION OF THE DRAWINGS

This invention is explained in greater detail in view of an exemplary embodiment represented in the drawings, wherein.

DESCRIPTION OF THE PREFERRED EMBODIMENTS

Figure 1:
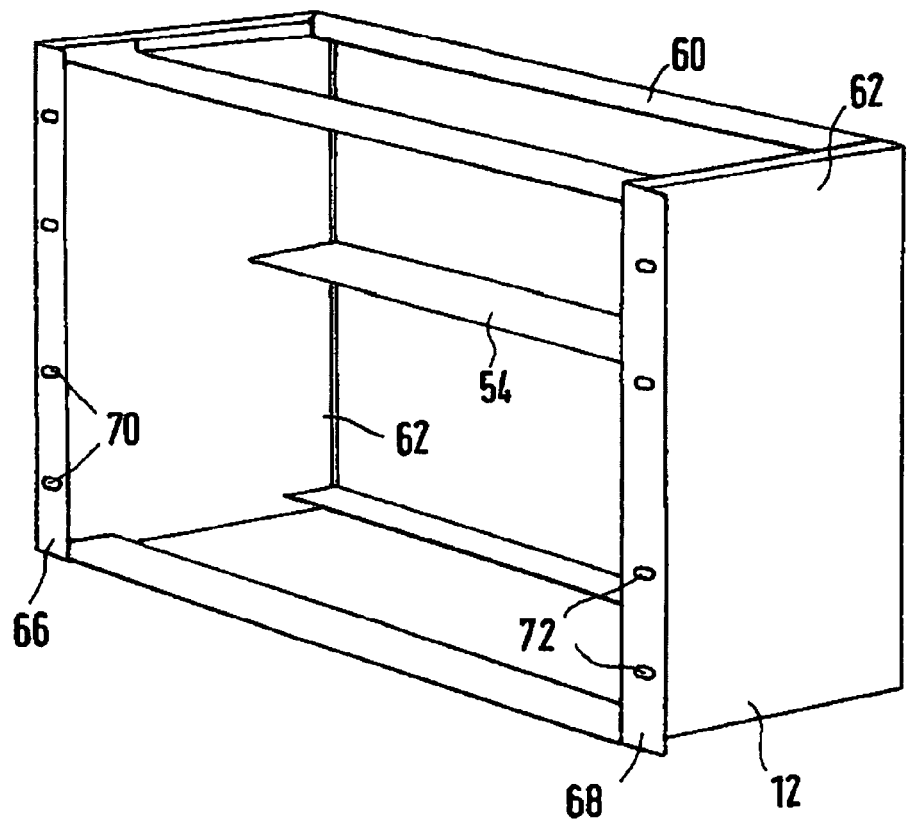
FIG. 1 shows a component support for receiving vertically arranged plug-in modules, in a schematic-perspective plan view.

In a schematic-perspective plan view, FIG. 1 shows a component support 12 for receiving vertically arranged plug-in modules (not represented). The component support 12 has a support frame 60 with vertical and horizontal profiled frame sections. The two lateral elements of the component support 12 shown in FIG. 1 have lateral walls 62. A bottom plate and a cover plate are not installed. However, such plates can be attached in a perforated or non-perforated arrangement. A rear wall is also omitted. However, the component support 12 shows a transverse strut 54, embodied as a T-strut, in the area of or near its rear wall. The component support 12 is open at the front. There, plug-in modules can be inserted into guide rails (not represented) and, in the inserted state, can be fixed in place on the component support 12 by screw connections. On the left and right sides, the edge area of the front has a laterally protruding frame element 66 and 68, in which several through-bores 70 and 72 for mounting on a switchgear cabinet (not represented) are cut.

Figure 2:
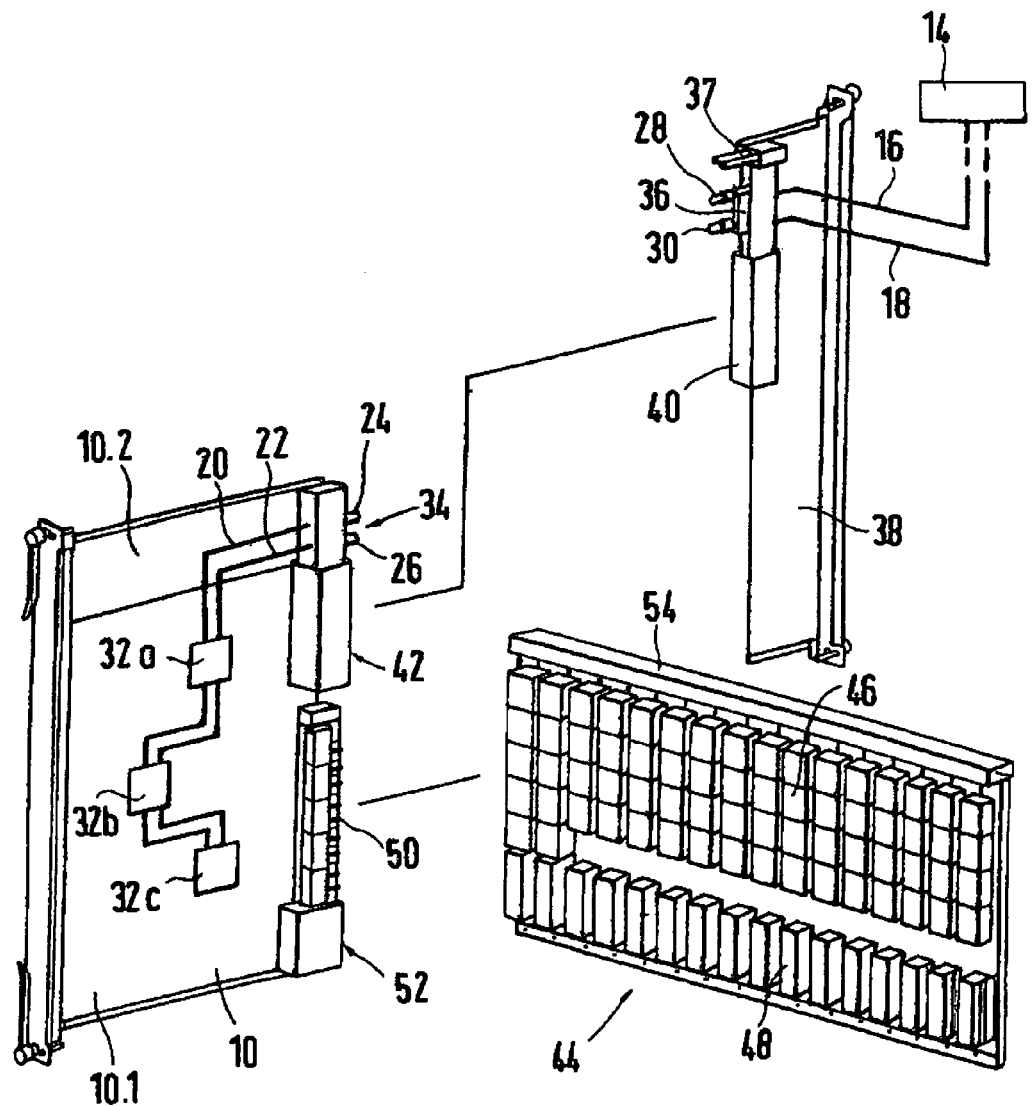
FIG. 2 shows a component support, a rear transition module and a rear wall plate in accordance with a first embodiment of the cooling arrangement of the invention, in a schematic-perspective plan view.

In a schematic perspective plan view, FIG. 2 shows a plug-in module 10, a rear transition module 36 and a rear wall plate 44 in accordance with one embodiment of the cooling arrangement in accordance with this invention, in a separate arrangement. The components shown can be installed in a component support 12 in accordance with FIG. 1.

Figure 3:
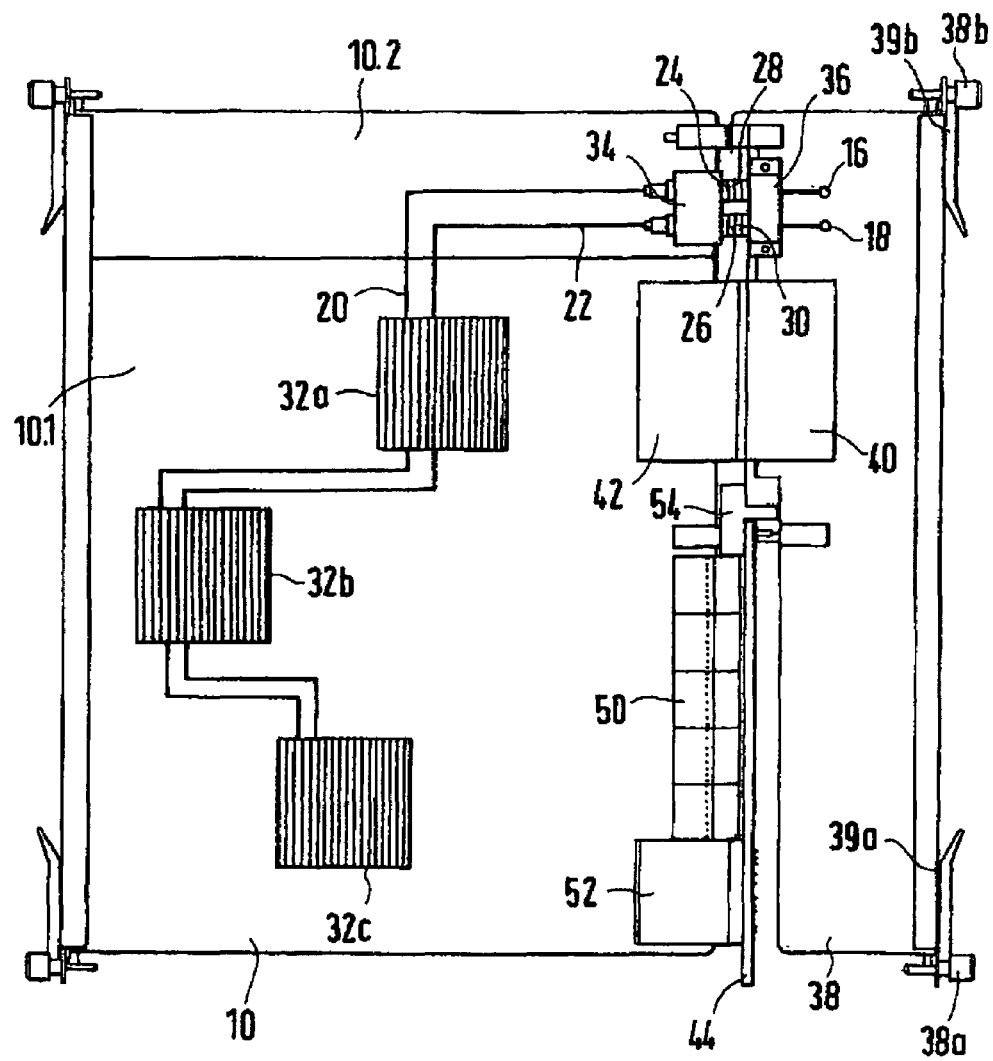
FIG. 3 shows the component support, the rear transition module and the rear wall plate in accordance with FIG. 2 in an assembled arrangement, in a schematic lateral view.

FIG. 3 shows the component support 12, the rear transition module 38 and the rear wall plate 44 in accordance with FIG. 2 in an assembled state.

A schematically represented air-conditioning device 14 is connected via a coolant-conducting feed line 16 and a return-flow line 18 with three liquid cooling bodies 32a, 32b and 32c, through which liquid flows for cooling electronic components (not represented) on the plug-in module 10. The electronic components to be cooled are connected with the liquid cooling bodies 32a, 32b and 32c, through which liquid flows, via a connector for the component feed line 20 and a connector for the component return-flow line 22. The liquid cooling bodies 32a, 32b and 32c are connected with each other in series by the component feed line 20 and the component return-flow line 22, wherein the component feed line 20 and the component flow-return line 22 have coupling elements 24 and 26 attached with their ends to the plug-in module 10. The coupling elements 24 and 26 are arranged in the upper edge area of the plug-in module 10 in a coupling area 10.2, which is kept free of other electronic components. Together with counter coupling elements 28 and 30 of the feed line 16 and the return-flow line 18 attached by their ends to the rear transition module 38, the coupling elements 24 and 26 form a releasable coupling connection. The rear transition module 38 is arranged at the rear wall of the component support 12 in accordance with FIG. 1 and forms a part of its rear wall.

Besides the coupling area 10.2, the plug-in module 10 has an adjoining fitting area 10.1 for the electronic components. The output components which are to be cooled and which have the liquid cooling bodies 32a, 32b and 32c, through which liquid flows, are here arranged. The releasable coupling of the feed line 10 with the component feed line 20 and the releasable coupling of the return-flow line 18 with the component return-flow line 22 is provided in the coupling area 10.2.

FIG. 3 shows the coupling element 24 of the component feed line 20 and the coupling element 26 of the component return-flow line 22 housed side-by-side in a plug housing and constitute a coupling block 34. The counter coupling element 28 of the feed line 16 and the counter coupling element 30 of the return-flow line 18 are housed side-by-side in a plug housing and form a counter coupling block 36. The coupling connection formed by bringing both coupling blocks 34 and 36 together is designed as a no-drip releasable and pluggable coupling.

FIG. 2 shows that the feed line 16 and the return-flow line 18 extend horizontally at least in sections in the housing 12 or along the rear inside wall. This makes it possible to house a plurality of identical liquid-cooled plug-in modules 10 vertically and extending parallel with respect to each other in the housing 12, and each can be coupled by a liquid-conducting coupling connection with the horizontally extending feed line 16 and the horizontally extending return-flow line 18. It is possible for this purpose to arrange rear transition modules 38, which are aligned parallel with respect to each other, along the horizontally extending feed and return-flow lines 16 and 18, each of which can, by coupling blocks 36 attached to them, connect coupling blocks 34 of inserted plug-in modules 10.

The horizontally extending feed line 16 and the horizontally extending return-flow line 18 each make a transition into an ascending line leading vertically to the air-conditioning device 14.

In particular, if a plurality of component supports in accordance with FIG. 1 is arranged one on top of the other in a switchgear cabinet (not represented), the feed line 16 and the return-flow line 18 are formed of ascending lines extending at least partially vertically inside the switchgear cabinet. With such an arrangement the ascending lines lead to the air-conditioning device 14 arranged in the upper area of the switchgear cabinet.

In accordance with an alternate embodiment (not represented), a fan or a fan system for generating a cooling air flow can be arranged at the switchgear cabinet, the component support 12 or the respective plug-in modules 10.

In the embodiment shown in FIGS. 2 and 3, a portion of the device rear wall is formed by the rear transition module 38 at the rear of the housing. This module has a plurality of electrical plug connectors, which engage counter plug connectors attached to the plug-in module 10. The rear transition module 38 is attached to the component support 12 by screw connections 38a and 38b at the rear. Manipulation during the insertion into the correct position is made easier by lockable insertion/removal handles 39a and 39b arranged at the lower and upper partial area of the rear transition module.

The plug-in modules 10 can also be inserted and pulled out at the front of the component support 12 with the aid of lockable insertion/removal handles. In the inserted position, the plug-in modules 10 can be fixed in place in the component support 12 by screw connections.

In its upper area facing the plug-in module 10, the rear transition module 38 at the rear of the housing has plug connectors 40 for electrical input and output signals. Corresponding counter plug connectors 42 at the plug-in module 10 engage the plug connectors 40. The coupling elements 24 and 26 of the component feed line 20 or component return-flow line 22 are arranged on the plug-in module 10 in the area of or near the electrical counter plug connectors 42. The counter coupling elements 28 and 30 of the feed line 16 or the return-flow line 18 are arranged on the rear transition module 38.

Guide pins 37, oriented in the direction toward the inserted plug-in module 10, for the assured plugging together of the plug-in module 10 with the electrical plug connectors 42, 50 and 52, and the liquid-conducting coupling connectors 24 and 26 are arranged at the upper partial area of the rear transition module 38.

German Patent Reference 10 2004 054337.2-34, the priority document corresponding to this invention, and its teachings are incorporated, by reference, into this specification.

What is claimed is:

1. A cooling arrangement with a housing for receiving electronic printed circuit boards or plug-in modules with at least one electronic component to be cooled on the respective printed circuit board or plug-in module, the cooling arrangement comprising:

an air-conditioning device (14) having a coolant-conducting feed line (16) and a return-flow line (18);

a component support (12) formed of a support frame (60);

each of the printed circuit boards or plug-in modules being releasably connected to a front of the support frame (60), and having an area (10.1) for fitting electronic components and a coupling area (10.2) including a component feed line (20) with a first coupling element (24) and a component return-flow line (22) with a second coupling element (26); and rear transition modules (38) forming a portion of a rear wall of the housing (12), each of the rear transition modules (38) releasably connected to the housing by screw connections (38a, 38b), each of the rear transition modules (38) assigned a corresponding printed circuit board or plug-in module, each of the rear transition modules (39) including a plug connector (40) for electrical input and output signals, which are engaged by a corresponding electric counter plug connector (42) of the printed circuit board or the plug-in module;

each of the rear transition modules (38) including a first counter coupling element (28) connected to the feed line (16) and a second counter coupling element (30) connected to the return-flow line (18), wherein the first counter coupling element (28) forms a releasable coupled connection with the first coupling element (24) and the second counter coupling element (30) forms a releasable coupled connection with the second coupling element (26).

2. The cooling arrangement in accordance with claim 1, wherein each front side edge of the support frame (60) includes a laterally protruding frame element (66, 68) having a plurality of through-bores (70, 72), for mounting the component support (12) to the housing.

3. The cooling arrangement in accordance with claim 1, further comprising a rear wall plate (44) connected to the support frame (60) and disposed between the rear transition modules (38) and the electronic printed circuit boards or plug-in modules.

4. The cooling arrangement in accordance with claim 3, wherein the support frame (60) comprises a transverse strut (54) extending across the rear of the component support (12) for supporting the rear wall plate (44).

5. The cooling arrangement in accordance with claim 3, wherein each of the electronic printed circuit boards or plug-in modules includes a plurality of electrical plug connectors that engage counter plug connectors of the rear wall plate (44).

6. The cooling arrangement in accordance with claim 1, wherein the coupling area (10.2) adjoins the area (10.1) for fitting.

7. The cooling arrangement in accordance with claim 6, wherein the coupling area (10.2) is at an upper edge area of the printed circuit board (10) or the plug-in module.

8. The cooling arrangement in accordance with claim 7, wherein the coupling element (24) of the component feed line (20) and the coupling element (26) of the return-flow line (22) are arranged side-by-side in a plug housing and form a coupling block (34).

9. The cooling arrangement in accordance with claim 8, wherein the counter coupling element (28) of the feed line (16) and the counter coupling (30) element of the return-flow line (18) are arranged side-by-side in a plug housing and form a counter coupling block (36).

10. The cooling arrangement in accordance with claim 9, wherein the coupling connection is a no-drip releasable and pluggable coupling.

11. The cooling arrangement in accordance with claim 1, wherein the coupling area (10.2) is at an upper edge area of the printed circuit board (10) or the plug-in module.

12. The cooling arrangement in accordance with claim 1 wherein the coupling element (24) of the component feed line (20) and the coupling element (26) of the return-flow line (22) are arranged side-by-side in a plug housing and form a coupling block (34).

13. The cooling arrangement in accordance with claim 1, wherein the counter coupling element (28) of the feed line (16) and the counter coupling (30) element of the return-flow line (18) are arranged side-by-side in a plug housing and form a counter coupling block (36).

14. The cooling arrangement in accordance with claim 1, wherein the coupling connection is a no-drip releasable and pluggable coupling.

* * * * *